United States Patent
Goh et al.

(10) Patent No.: US 8,642,396 B2
(45) Date of Patent: Feb. 4, 2014

(54) ULTRA-THIN QUAD FLAT NO-LEAD (QFN) PACKAGE

(75) Inventors: Kim-yong Goh, Singapore (SG); Tong-yan Tee, Singapore (SG)

(73) Assignee: STMicroelectronics, Inc., Coppell, TX (US)

( * ) Notice: Subject to any disclaimer, the term of this patent is extended or adjusted under 35 U.S.C. 154(b) by 358 days.

(21) Appl. No.: 13/196,641

(22) Filed: Aug. 2, 2011

(65) Prior Publication Data

US 2012/0028397 A1    Feb. 2, 2012

Related U.S. Application Data

(62) Division of application No. 11/602,098, filed on Nov. 20, 2006, now Pat. No. 8,018,036.

(30) Foreign Application Priority Data

Nov. 21, 2005 (SG) .................................. 200507285

(51) Int. Cl.
   *H01L 21/44* (2006.01)
(52) U.S. Cl.
   USPC ........................................................ 438/123
(58) Field of Classification Search
   USPC ......... 438/106, 108–109, 121, 123, 612, 614, 438/617
   See application file for complete search history.

(56) References Cited

U.S. PATENT DOCUMENTS

| | | | |
|---|---|---|---|
| 6,339,255 B1 * | 1/2002 | Shin | 257/686 |
| 6,605,866 B1 * | 8/2003 | Crowley et al. | 257/692 |
| 6,781,243 B1 | 8/2004 | Li et al. | |
| 6,841,854 B2 | 1/2005 | Itou et al. | |
| 6,858,933 B2 | 2/2005 | Abela et al. | |
| 7,795,078 B2 | 9/2010 | Ramakrishna et al. | |
| 2004/0061217 A1 | 4/2004 | Ku et al. | |
| 2007/0117450 A1 | 5/2007 | Truxes | |

* cited by examiner

*Primary Examiner* — Hoa B Trinh
(74) *Attorney, Agent, or Firm* — Munck Wilson Mandala, LLP

(57) ABSTRACT

An ultra-thin Quad Flat No-Lead (QFN) semiconductor chip package having a leadframe with lead terminals formed by recesses from both the top and bottom surfaces and substantially aligned contact areas formed on either the top or bottom surfaces. A die is electrically connected to the plurality of lead terminals and a molding compound encapsulates the leadframe and die together so as to form the ultra-thin QFN package. Accordingly, the substantially aligned contact areas are exposed on both the top and bottom surfaces of the package. The present disclosure also provides an ultra-thin Optical Quad Flat No-Lead (OQFN) semiconductor chip package, a stacked semiconductor module comprising at least two QFN semiconductor chip packages, and a method for manufacturing an ultra-thin Quad Flat No-Lead (QFN) semiconductor packages.

23 Claims, 4 Drawing Sheets

ULTRA-THIN QUAD FLAT NO-LEAD (QFN) PACKAGE

CROSS-REFERENCE TO RELATED APPLICATIONS

This application is a divisional of U.S. patent application Ser. No. 11/602,098 filed Nov. 20, 2006, now U.S. Pat. No. 8,018,036.

TECHNICAL FIELD

The present disclosure generally relates to semiconductor chip packages and packaging technologies, and more particularly to an ultra-thin quad flat no-lead package and method of fabricating the package.

BACKGROUND

Quad Flat No-lead (QFN) semiconductor chip packaging technology provides compact and reliable chip packages. The size of a semiconductor chip package, especially the height, is important in increasing the density of semiconductor chips in an electronic device. For example, conventional methods disclose a semiconductor package that comprises an external leadless leadframe package and an internal package, wherein the internal package is disposed within the cavity of the external leadless leadframe package, resulting in an increase of chip density within the semiconductor package.

In order for the internal package to be disposed within the cavity, the dimension of the internal package is minimized by having an exposed die on the package bottom surface and exposed leads on the package top and bottom surfaces. However, the exposed contact areas of the leads on the top and bottom package surfaces are not aligned in the package thickness direction due to one-sided recesses formed in the leads. This leadframe design has certain disadvantages such as warpage, variation, and delamination. Furthermore, the disclosed internal package lacks versatility of stacking two or more packages or stacking one package in two different directions. The reason for why the contact areas of the leads are offset may be due to the limitation of the method used to manufacture the leadframe. As is well known, the method of manufacturing this type of leadframe is using two photolithography masks for half-etching on the top and bottom surfaces of the raw leadframe material, so as to achieve the necessary recesses on the inner lead structure.

The semiconductor chip in a QFN package may be optical sensor die when the QFN package is an optical sensor. The typical Optical Quad Flat No-Lead (OQFN) packages known to those in the art include a die or dies settling in a molded cavity and a glass lid sitting on the top of the molded cavity so that lights can pass through the glass lid and then reach the die without interference. FIG. 1 illustrates a schematic cross-section of the current OQFN package that has a leadframe providing inner leads 1 and a die-attach pad 2, a die attach adhesive layer 3, a die 4 being attached to the die-attach pad by the die attach adhesive layer 3, a molded wall 5 forming a molded cavity enabling the die to be settled within the cavity, a glass attach 6 forming at the top inner edge of the molded wall, and a glass lid 7 sitting on the top of the glass attach so that the molded cavity with the die is encapsulated. Because the die is exposed in the molded cavity, the lights can reach the die directly through the glass lid. However, the current OQFN package has certain disadvantages. Among them are thick package with a total package height over 1.5 mm, high tooling cost for requiring dedicated cavity mold for different sized OQFN packages, material cost for glass lid and attach, and additional process steps of glass lid attach.

Accordingly, what is needed is an ultra-thin Quad Flat No-Lead (QFN) semiconductor chip package and method of making the same, wherein the QFN chip packages have the versatility of being stacked in different directions or numbers. More specifically, what is needed is an ultra-thin optical QFN (OQFN) package that is thin and can be manufactured in less process steps than the known OQFN packages.

SUMMARY

This disclosure provides a ultra-thin Quad Flat No-Lead (QFN) semiconductor chip package having the versatility of being stacked in different directions or numbers. The QFN package is thin and may be manufactured using relatively less process steps than the known ultra-thin optical QFN (OQFN) packages.

In one embodiment, the present disclosure provides an ultra-thin Quad Flat No-Lead (QFN) semiconductor chip package having a leadframe. The leadframe includes a top surface and a bottom surface opposite to the top surface; wherein the leadframe has a plurality of leads so configured as to have lead terminals formed by recesses from both the top and bottom surfaces, and contact areas formed on either the top or bottom surfaces. The contact areas of the top surface are substantially aligned with the contact areas of the bottom surface. The die is disposed in a manner such that the die is electrically connected to the plurality of lead terminals. A molding compound encapsulates the leadframe and die together so as to form the ultra-thin QFN package. Accordingly, the substantially aligned contact areas are exposed on both the top and bottom surfaces of the package.

In another embodiment, the present disclosure provides an ultra-thin Optical Quad Flat No-Lead (OQFN) semiconductor chip package having a leadframe. The leadframe includes a top surface and a bottom surface opposite to the top surface. The leadframe has a plurality of leads so configured as to have lead terminals formed by recesses from both the top and bottom surfaces, and contact areas formed on either the top or bottom surfaces. The contact areas of the top surface are substantially aligned with the contact areas of the bottom surface. The package includes a light sensor die disposed in a manner such that the die is electrically connected to the plurality of lead terminals. The package also includes a transparent moulding compound for encapsulating the leadframe and die so as to form the OQFN semiconductor chip package. Accordingly, the light is allowed to reach the light sensor die through the transparent moulding compound. Thus, the substantially aligned contact areas are exposed on both the top and bottom surfaces of the package.

In yet another embodiment of the present disclosure, a stacked semiconductor module having at least two QFN semiconductor chip packages is provided. The QFN semiconductor chip package includes a leadframe having a top surface and a bottom surface opposite to the top surface. The leadframe has a plurality of leads so configured as to have lead terminals formed by recesses from both the top and bottom surfaces, and contact areas formed on either the top or bottom surfaces. The contact areas of the top surface are substantially aligned with the contact areas of the bottom surface. The die is disposed in such a manner so that the die is electrically connected to the plurality of lead terminals. The module includes a moulding compound for encapsulating the leadframe and die so as to form the ultra-thin QFN package. Accordingly, the substantially aligned contact areas are exposed on both the top and bottom surfaces of the package and the two QFN semiconductor chip packages are stacked together through the substantially aligned contact areas.

In still another embodiment, the present disclosure provides a method for manufacturing an ultra-thin Quad Flat No-Lead (QFN) semiconductor packages. The method includes providing a leadframe having a top surface and a bottom surface opposite to the top surface. The leadframe has a plurality of leads so configured as to have lead terminals formed by recesses from both the top and bottom surfaces, and contact areas formed on either the top or bottom surfaces. The contact areas of the top surface are substantially aligned with the contact areas of the bottom surface. The method also includes disposing a die so that the die can be electrically connected to the plurality of leads of the leadframe. The die is electrically connected to the plurality of leads of the leadframe. The method further includes molding the leadframe and die to form the ultra-thin QFN semiconductor package. Accordingly, the substantially aligned contact areas are exposed on both the top and bottom surfaces of the package.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Throughout this application, where publications are referenced, the disclosures of these publications are hereby incorporated by reference, in their entireties, into this application in order to more fully describe the state of art to which this disclosure pertains.

The present disclosure provides an ultra-thin Quad Flat No-Lead (QFN) semiconductor chip package, an ultra-thin Optical Quad Flat No-Lead (OQFN) semiconductor chip package, and methods of manufacturing the packages. The following description will omit details of materials and process techniques that are known to those skilled in the art. The omissions is are for the sake of brevity and no obscurity of do not obscure the principles or the implementations of the present disclosure.

Figure 1:
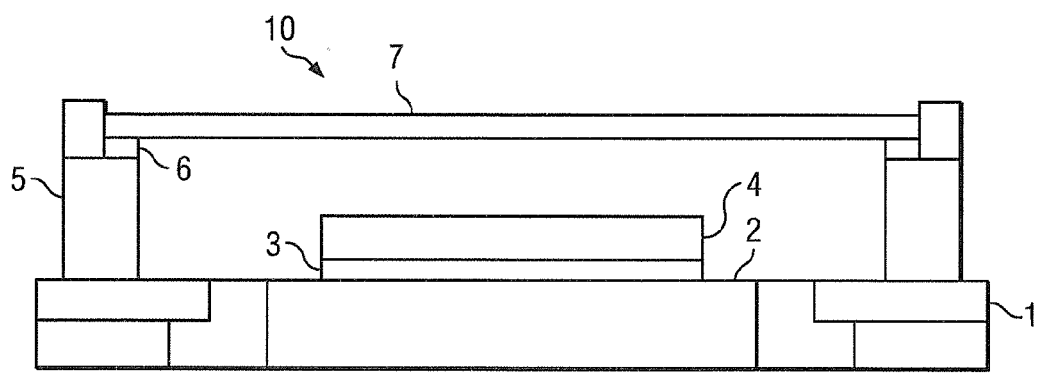
FIG. 1 is a simplified cross-sectional view of a conventional OQFN package.
Figure 2:
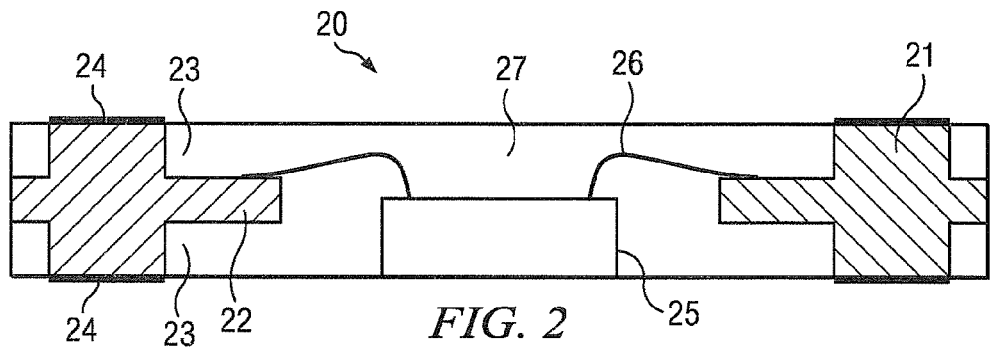
FIG. 2 is a simplified cross-sectional view of the QFN package according to one embodiment of the present disclosure.

FIG. 2, is a simplified cross-sectional view of the QFN package according to one embodiment of the present disclosure. The QFN package 20 includes a leadframe 21, a die 25, and a molding compound 27. The leadframe 21 has a top surface and a bottom surface opposite to the top surface. It is to be noted that the designation of the top and bottom surfaces is only for the sake of convenience of description. It by no means denotes the physical directions of the leadframe. The leadframe 21 has a plurality of leads, wherein the leads are so configured that they have lead terminals 22 formed by recesses 23 from both the top and bottom surfaces, and contact areas 24 formed on both the top and bottom surfaces of the leadframe, wherein the contact areas on the top surface are substantially aligned with the ones on the bottom surface. The leadframe 21 may be made of any suitable materials for use in semiconductor chip packages. Of course, specific materials may be used for certain packages with specific purposes.

While the lead terminals can be off the center line of the leadframe, i.e., the center line of the QFN package as shown hereinafter, in certain embodiments the leadframe may be symmetrical about the center line in the package thickness direction. For example, as shown in FIG. 2, the lead terminals 22 are in alignment with the center line of the leadframe, i.e., the center line of the semiconductor package. One advantage of such a configuration is that the leadframe loading direction during the manufacturing process is not so critical. Thus, any mistake in this step caused by an operator would not result in substantial yield loss as compared to traditional QFN designs.

The die 25 is electrically connected to the lead terminals 22 by the bonding wires 26. As will be seen, other means such as solder bumps may also be used to electrically connect the die to the lead terminals. The molding compound 27 may be any suitable molding material. The molding can be done using any suitable molding technique. It is preferable to use the transfer molding technique. As can be seen from FIG. 2, the molded QFN package has a thickness of the leadframe 21, making it ultra-thin. In addition, the backside of the die is exposed to the bottom surface of the package, providing excellent thermal performance. Furthermore, the contact areas 24 are exposed to both the top and bottom surfaces respectively, rendering the packages to be very versatile in further manipulation.

The present disclosure further provides an ultra-thin Optical Quad Flat No-Lead (OQFN) semiconductor chip package. As aforementioned, the OQFN package in the prior art has a bulk configuration because it has to form a cavity for the optical die and use the glass lid to let the light pass through. In certain embodiments of present disclosure, the OQFN package may have a similar or identical configuration as shown in FIG. 2 with modifications. To make an OQFN package similar to one as shown in FIG. 2, the die 25 is an optical sensor die, and the molding compound 27 is a transparent molding material allowing the light pass through the molding compound to reach the optical sensor die. The optical sensor die suitable for the present disclosure may be any available one.

Figure 3:
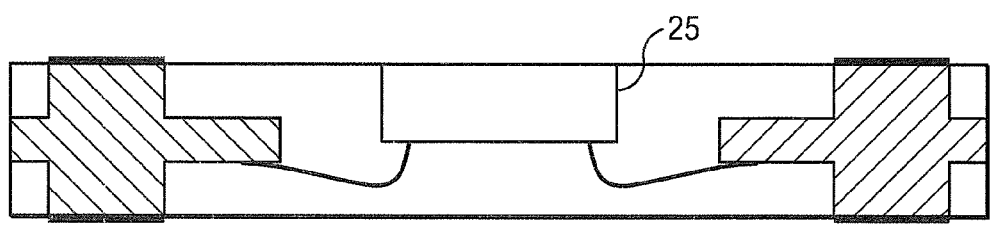
FIG. 3 is a simplified cross-sectional view of the QFN package with a wire-bond, die-down configuration according to one embodiment of the present disclosure.
Figure 4:
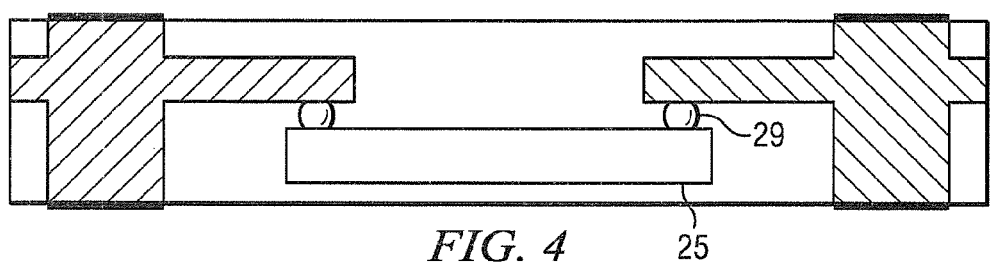
FIG. 4 is a simplified cross-sectional view of the QFN package with a flip-chip configuration according to one embodiment of the present disclosure.

Many variations of the configuration shown in FIG. 2 are possible in accordance with the present disclosure. For example, FIG. 3 illustrates a wire-bond, die-down configuration of the QFN package, where the die 25 is in a down position. It is noted that FIG. 3 has a mirror image of FIG. 2. As another example, FIG. 4 illustrates a flip-chip configuration of the QFN package, where the die 25 is electrically connected to the lead terminals by solder bumps 29. It is noted that the lead terminals are off from the center line of the leadframe and the semiconductor package.

Figure 5A:
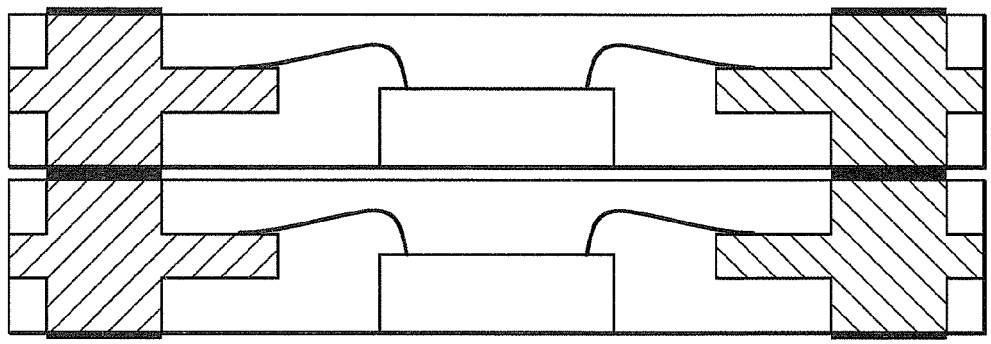
FIG. 5A illustrates a stacked QFN module having two wire-bond, die-up QFN packages according to one embodiment of the present disclosure.
Figure 5B:
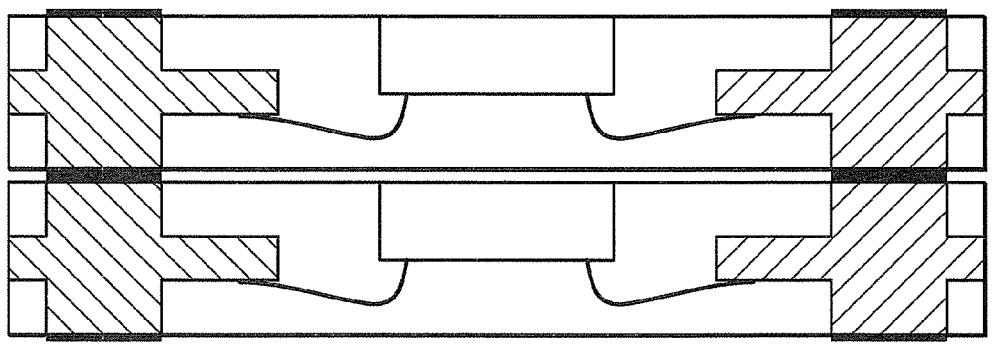
FIG. 5B illustrates a stacked QFN module having two wire-bond, die-down QFN packages according to one embodiment of the present disclosure.
Figure 5C:
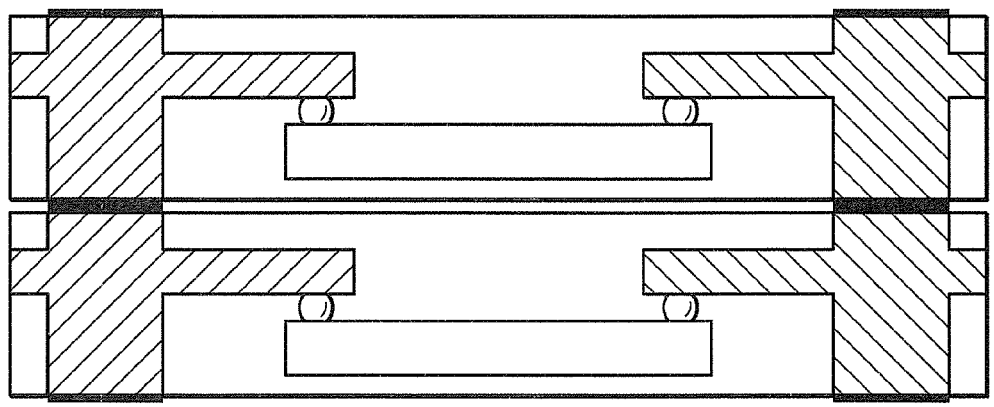
FIG. 5C illustrates a stacked QFN module having two flip-chip QFN packages according to one embodiment of the present disclosure.
Figure 5D:
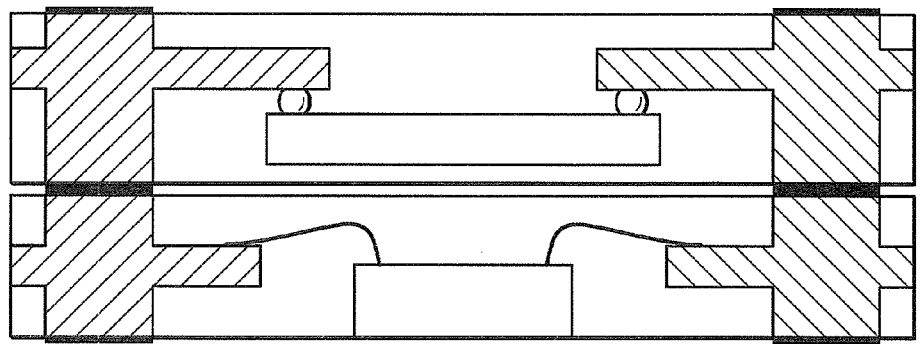
FIG. 5D illustrates a stacked QFN module having one wire-bond, die-up QFN package and one flip-chip QFN package according to one embodiment of the present disclosure.

As mentioned earlier, the QFN packages provided by the present disclosure have the versatility of forming stacked QFN modules by utilizing the exposed, substantially aligned contact areas. Since the contact areas of the leads are exposed on both sides of the molded package, electrical connections can be established on both sides to allow for stacked package configuration. The techniques for establishing the electrical connections include solder plating, solder bump, or the like. As still another example, FIG. 5A illustrates a stacked QFN module having two wire-bond, die-up QFN packages, where the top one may be an OQFN package and the bottom one may be any other package such as RF device. Thus, the stacked QFN module may perform different functions. As yet another example, FIG. 5B illustrates a stacked QFN module having two wire-bond, die-down QFN packages. As still another example, FIG. 5C illustrates a stacked QFN module having two flip-chip QFN packages. In another example, FIG. 5D illustrates a stacked QFN module having one wire-bond, die-up QFN package and one flip-chip QFN package. It is to be appreciated that the number and type of QFN packages in a stacked QFN module are only limited by a user's imagination.

Figure 6:
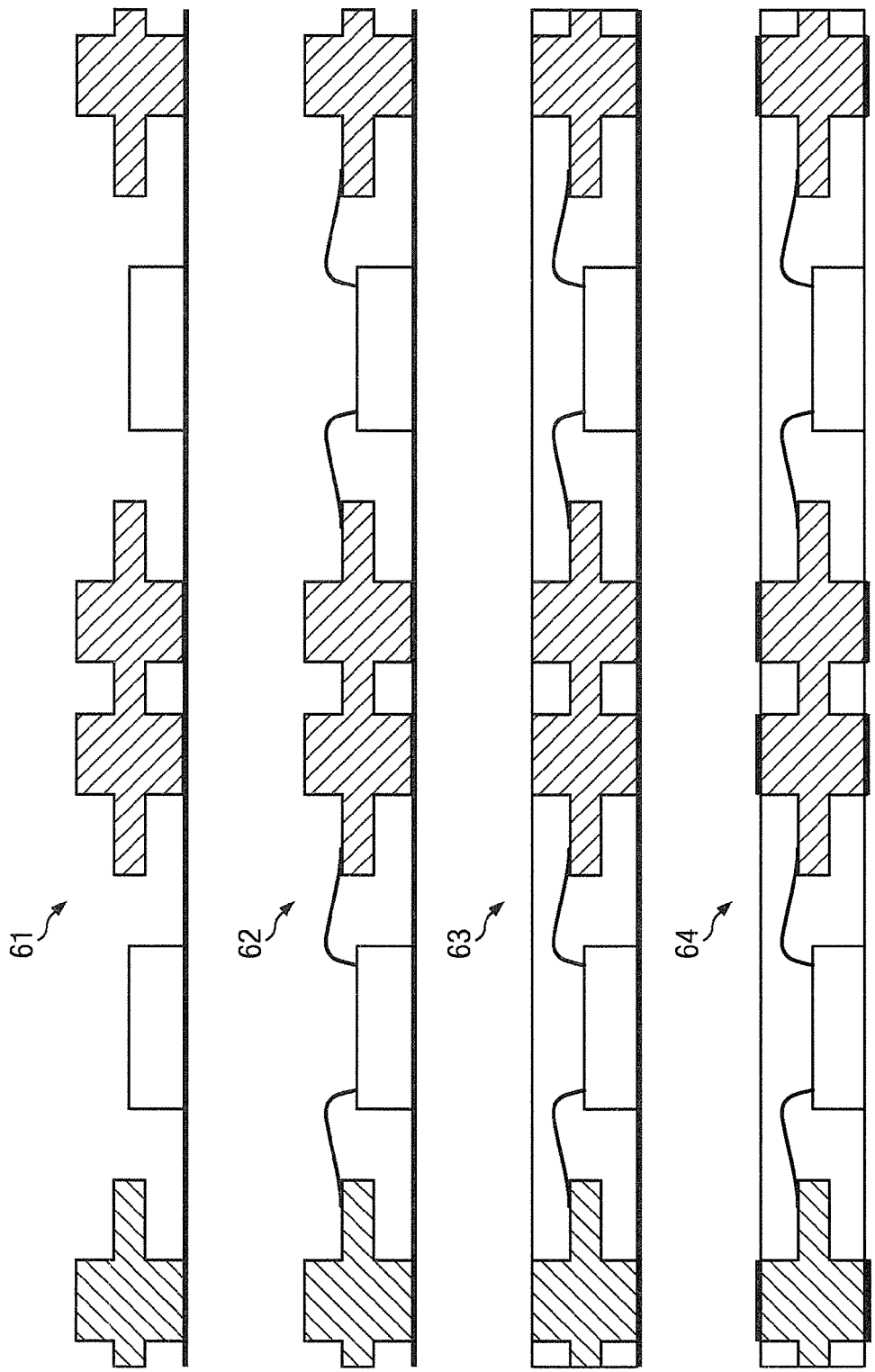
FIG. 6 illustrates a general process of manufacturing a wire-bond, die-up QFN package according to one embodiment of the present disclosure.

The present disclosure also provides a method for manufacturing the ultra-thin QFN semiconductor chip packages. For example, FIG. 6 illustrates a general process for manufacturing the wire-bond, die-up QFN package. The leadframe may be prepared by doing a full etching to produce the required lead pattern, followed by partial etching on the top and bottom surfaces of the lead pattern to achieve the desired lead structure. After the leadframe is securely attached to an adhesive tape, the die is adhered onto the tape by thermocompression 61; then the die is electrically connected to the lead terminals by wire-bonding process 62; then the leadframe and die are molded together by the molding process 63, followed by removing the tape; and then the contact areas are plated with a plating process 64 before the singulation. It is to be noted that the techniques and procedures for performing each step of this method should be understood by those skilled in the art. The components appearing in FIGS. 3-6 are similar to or identical to the ones appearing in FIG. 2. Thus, such components are not labeled in FIGS. 5A-6 simply to avoid repetition.

The ultra-thin Quad Flat No-Lead (QFN) semiconductor chip package fabricated in accordance with embodiments of the present disclosure can be employed in a variety of applications and electronic products. For example, the end-products embedding the chip packages of the present disclosure may be used in portable applications including RF (radio frequency), power management, wireless LAN, and optical packaging. In addition, the chip packages of the present disclosure may be used in applications that require stacked packages (package-on-package) for multi-functional integration, e.g., stacking a DSP and memory for cell phone applications.

Figures 7, 8:
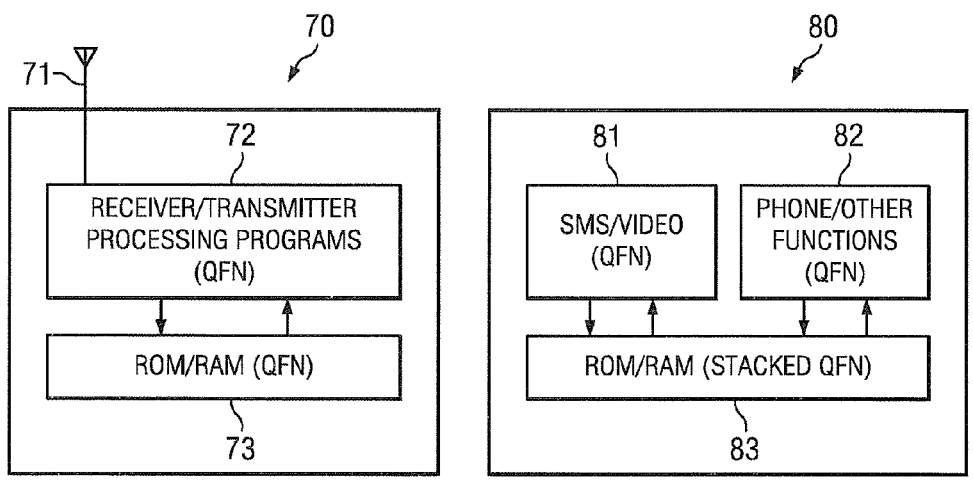
FIG. 7 is a schematic block diagram of a radio frequency transponder employing the QFNs according to one embodiment of the present disclosure.
FIG. 8 is a schematic block diagram of a mobile device employing the QFNs and stacked QFNs according to one embodiment of the present disclosure.

As shown in FIG. 7, a radio frequency transponder 70 comprises an antenna 71 for receiving and transmitting signals from an external device, a receiver/transmitter/processing programs (RTP) module 72 for processing the received signals, and a memory module with ROM/RAM 73 for providing computer-readable medium for embedding the processing programs and storing the received signals. The RTP module 72 and memory module 73 contain electronic circuitries that are made of the ultra-thin QFNs that are manufactured in accordance with the present disclosure. As shown in FIG. 8, a mobile device 80 includes an SMS/Video module 81 for sending/receiving SMS/Video, a phone module 82 for calling/answering phone calls, and a memory module with ROM/RAM 83 for providing computer-readable medium for embedding the processing programs and storing the received signals. All modules 81, 82, 83 contain electronic circuitries that are made of the ultra-thin QFNs that are manufactured in accordance with the present disclosure. In one embodiment, stacked QFNs are used.

One advantage of the present disclosure is that the contact areas are exposed on both sides of the molded package so that solder plating can be done on both sides to allow for stacked package configuration. Since the stacked package configuration basically uses the same leadframe design, it also helps to reduce the frame cost.

Another advantage of the present disclosure is that the OQFN package does not need glass lid in the packages, thus the process step of glass lid attach is eliminated and the material costs for the glass lid and attach are saved.

Yet another advantage of the present disclosure is that the package has improved thermal performance. Since the die is exposed on the package bottom surface, it is possible to improve the package thermal performance by adding an electrical non-conductive surface mount adhesive to the printed wire board during board assembly, so that the exposed die is thermally shorted to the ground copper planes of the PWB for excellent head dissipation.

Yet another advantage of the present disclosure is that the package has the flexibility of becoming a die-down version by flipping the package over when solder on board. An additional advantage to this die-down version is that an external heat sink can be attached directly to the exposed die back on the package top by means of a thermal interface material (see FIG. 3b) to improve the thermal performance. This is very useful in situation where even the PWB is thermally saturated and the viable heat flow path is through the package top, so having an exposed die-pad soldered to the PWB could not help much. Similarly the die-down version can be stacked and offers the flexibility of becoming a multi-functional package as in the die-up version.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method for manufacturing a semiconductor package, comprising:
providing a leadframe, wherein the leadframe has a top surface, a bottom surface opposite to the top surface, and a plurality of leads configured as to have lead terminals formed by recesses from both the top and bottom surfaces, wherein the recesses from both the top and bottom surfaces comprise a recess from the top surface disposed directly above a recess from the bottom surface, and contact areas formed on either the top or bottom surfaces, and wherein the contact areas of the top surface are substantially aligned with the contact areas of the bottom surface;
electrically connecting a die to the lead terminals of the leadframe; and
molding a compound encapsulating the leadframe and die together to form the semiconductor package while leaving the substantially aligned contact areas exposed on both the top and bottom surfaces of the package.

2. The method of claim 1, wherein the leadframe and die are encapsulated with a transparent molding compound.

3. The method of claim 1, wherein the die is electrically connected to the plurality of lead terminals by at least one of: wire bonding and solder bumping.

4. The method of claim 1, wherein the leadframe has no die-attach pad and the bottom surface of the die is coplanar with the bottom surface of the leadframe, the method further comprising:
exposing the backside of the die to the bottom surface of the package after molding.

5. The method of claim 1, wherein the leadframe has a symmetrical configuration.

6. The method of claim 1, wherein the die is a light sensor.

7. A method of forming a stacked semiconductor module comprising at least two semiconductor chip packages, the method comprising:
providing a leadframe for each semiconductor chip package, each leadframe having a top surface and a bottom surface opposite to the top surface, each leadframe having a plurality of leads with lead terminals formed by recesses from both the top and bottom surfaces, wherein the recesses from the top surface on each leadframe are disposed directly above a recess from the bottom surface of that respective leadframe, each leadframe including contact areas formed on either the top or bottom surfaces, wherein the contact areas of the top surface of each leadframe are substantially aligned with the contact areas of the bottom surface of that respective leadframe;
electrically connected a first die to the plurality of lead terminals on one of the leadframes and a second die to the plurality of lead terminals on another of the leadframes; and
molding a compound encapsulating each leadframe and the die connected thereto to form one of the packages, leaving the substantially aligned contact areas exposed on both the top and bottom surfaces of each package,
wherein the at least two semiconductor chip packages are stacked together through the substantially aligned contact areas.

8. The method of claim 7, wherein the integrated circuits within the die in each of the semiconductor chip packages are different so that the stacked semiconductor module performs multiple functions.

9. The method of claim 7, wherein the molding compound is transparent.

10. The method of claim 7, wherein each die is electrically connected to the plurality of lead terminals by at least one of: wire bonding and solder bumping.

11. The method of claim 7, wherein the leadframe has no die-attach pad and the bottom surface of the die is coplanar with the bottom surface of the leadframe, and wherein the backside of the die faces the bottom surface of the package after molding.

12. The method of claim 7, wherein each of the leadframes has a symmetrical configuration.

13. The method of claim 7, wherein the die is a light sensor.

14. A method of forming an article of manufacture having a semiconductor chip package, the method comprising:
providing a leadframe having a top surface and a bottom surface opposite to the top surface, wherein the leadframe has a plurality of leads each including at least one lead terminal formed by recesses from both the top and bottom surfaces, wherein the recesses from the top surface are disposed directly above a recess from the bottom surface, the leadframe further including contact areas formed on either the top or bottom surfaces, wherein the contact areas of the top surface are substantially aligned with the contact areas of the bottom surface;
electrically connecting a die to the plurality of lead terminals;
encapsulating the leadframe and die together with a molding compound while leaving the substantially aligned contact areas on both the top and bottom surfaces exposed; and
connecting a power signal interface to the semiconductor chip package via at least one of the lead terminals.

15. The method of claim 14, wherein the article further comprises a radio-frequency transponder.

16. The method of claim 14, wherein the semiconductor chip package manages the functions of the article in order to selectively control power usage of the article.

17. The method of claim 14, further comprising:
coupling a transponder to the semiconductor chip package via at least one of the lead terminals, wherein the transponder is configured to connect to a wireless local area network.

18. The method of claim 14, wherein the die of the semiconductor chip package is configured to perform a first function, the method further comprising:
providing at least one additional QFN semiconductor chip package having a die configured to perform a second function, wherein the QFN semiconductor chip packages are stacked together through the substantially aligned contact areas and wherein the article can perform the first and second functions.

19. The method of claim 14, wherein the article comprises a mobile communication device.

20. The method of claim 14, wherein the first function comprises digital signal processing and the second function comprises memory.

21. The method of claim 1, wherein the semiconductor package comprises a quad flat no-lead (GFN) package.

22. The method of claim 7, wherein each of the at least two semiconductor chip packages comprise a quad flat no-lead (QFN) package.

23. The method of claim 14, wherein the semiconductor chip package comprises a quad flat no-lead (QFN) package.

* * * * *